United States Patent [19]

Nezu

[11] Patent Number: 5,014,350

[45] Date of Patent: May 7, 1991

[54] APPARATUS FOR AND METHOD OF IMPROVING THE AFC OF A TELEVISION BROADCAST SATELLITE RECEIVER

[75] Inventor: Yasuhiko Nezu, Takarazuka, Japan

[73] Assignee: Sanyo Electric Co., Ltd., Moriguchi, Japan

[21] Appl. No.: 343,458

[22] Filed: Apr. 25, 1989

[30] Foreign Application Priority Data

Apr. 28, 1988 [JP] Japan .................. 63-106833
Aug. 9, 1988 [JP] Japan .................. 63-198421

[51] Int. Cl.⁵ .............................. H04N 7/20
[52] U.S. Cl. .......................... 455/258; 455/209; 358/191.1
[58] Field of Search ............ 455/207, 208, 209, 258, 455/164, 165, 260, 314, 315, 316, 229; 358/191.1, 195.1, 198

[56] References Cited

U.S. PATENT DOCUMENTS

| | | | |
|---|---|---|---|
| 4,162,452 | 7/1979 | Ash | 325/373 |
| 4,403,345 | 6/1983 | Granek et al. | 455/208 |
| 4,417,279 | 11/1983 | Shinkawa et al. | 358/195.1 |
| 4,581,643 | 4/1986 | Carlson | 358/191.1 |
| 4,727,591 | 2/1988 | Manlove | 455/182 |
| 4,817,197 | 3/1989 | Shimizu et al. | 455/208 |

FOREIGN PATENT DOCUMENTS 0179620A 10/1985 European Pat. Off.
59-3889 1/1984 Japan.
2143691A 2/1985 United Kingdom.

Primary Examiner—Reinhard J. Eisenzopf
Assistant Examiner—Edward Urban
Attorney, Agent, or Firm—Armstrong, Nikaido, Marmelstein, Kubovcik, & Murray

[57] ABSTRACT

A BS tuner (16a, 16b, 16c, 16d) comprises an AFC down-converter (80, 80a). The down-converter (80, 80a) comprises an oscillator (84, 85) and a mixer (86). The AFC down-converter (80, 80a) mixes a second IF signal with an oscillation signal output from the oscillator (84, 85). Consequently, a third IF signal having a frequency lower than the frequency of the second IF signal is obtained. At the time of receiving a MUSE signal, a counter circuit (46) counts the third IF signal. The frequency of the second IF signal is adjusted based on the result of counting by the counter circuit (46).

22 Claims, 10 Drawing Sheets

FIG. 3
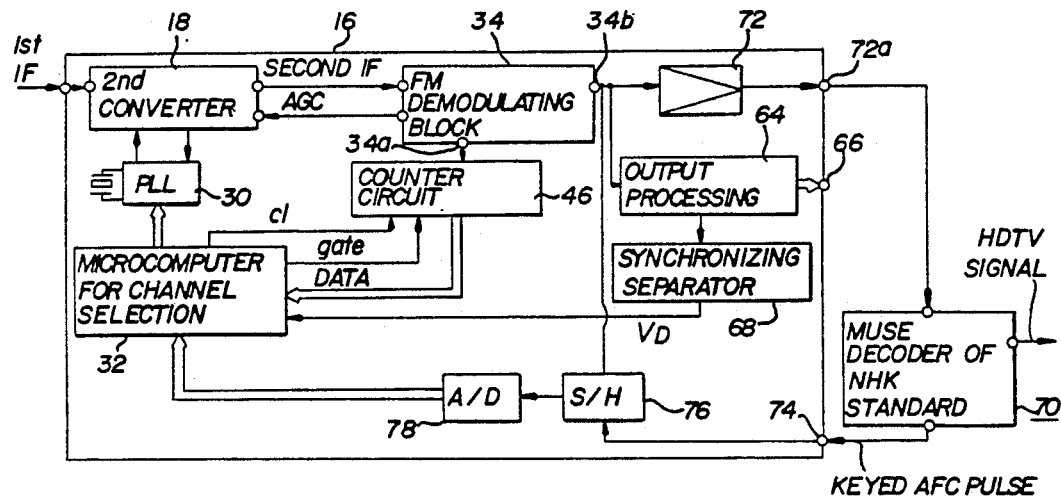
FIG. 2
PRIOR ART
FIG. 2 (a)
PRIOR ART
DEMODULATION OUTPUT
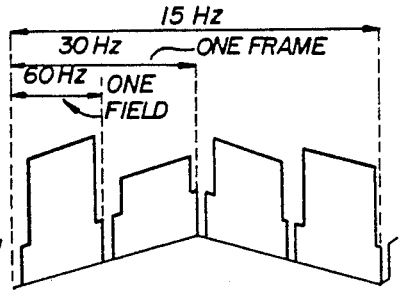
FIG. 2 (b) VD
PRIOR ART
FIG. 2 (c) cl
PRIOR ART
FIG. 2 (d) gate
PRIOR ART

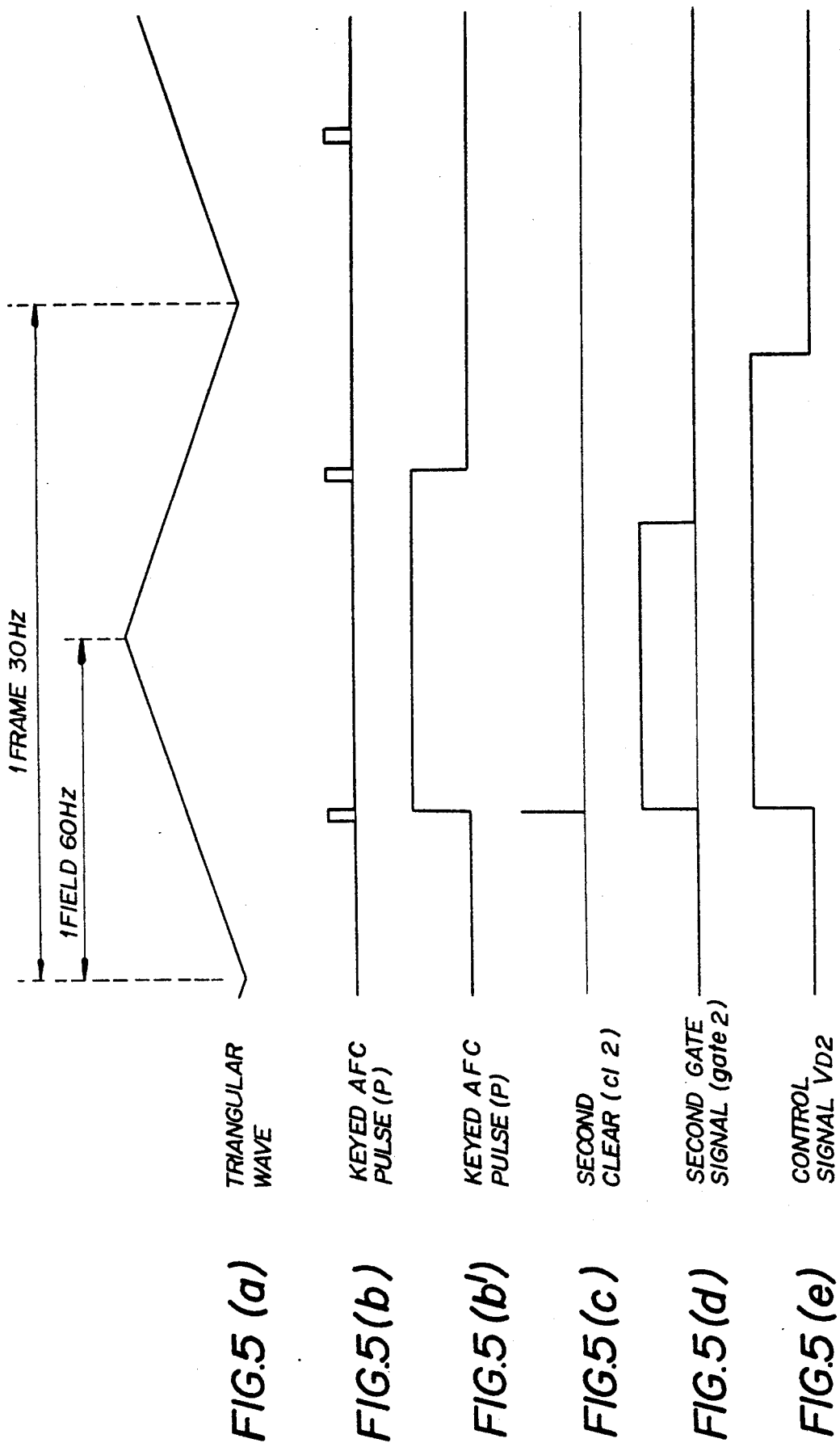

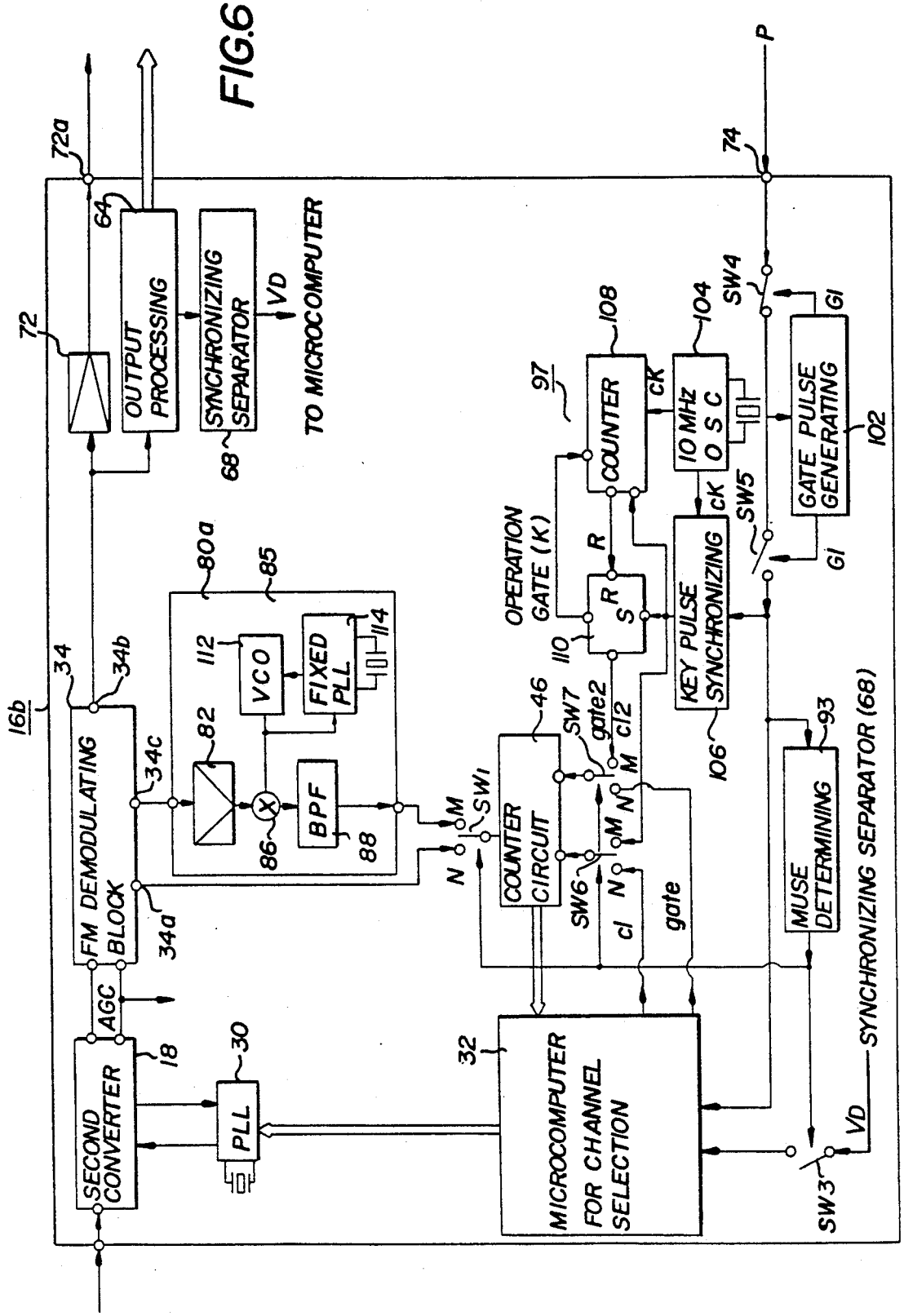

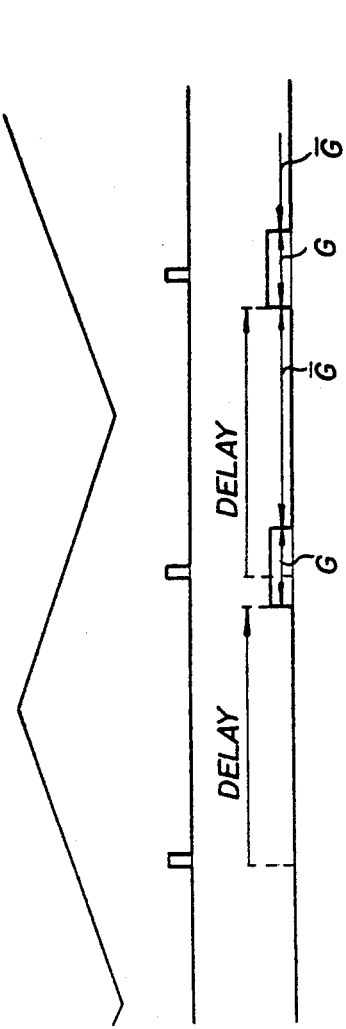

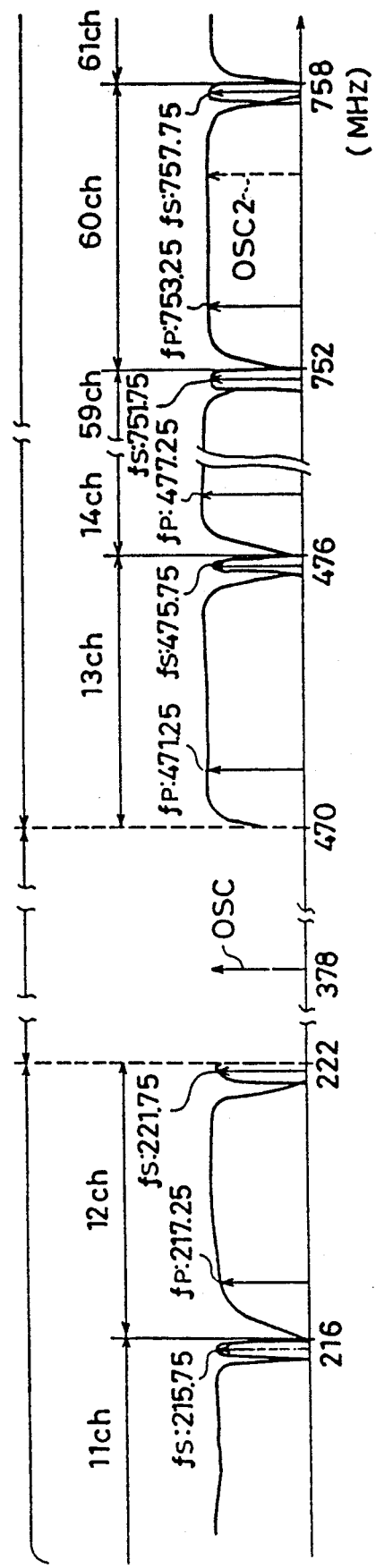
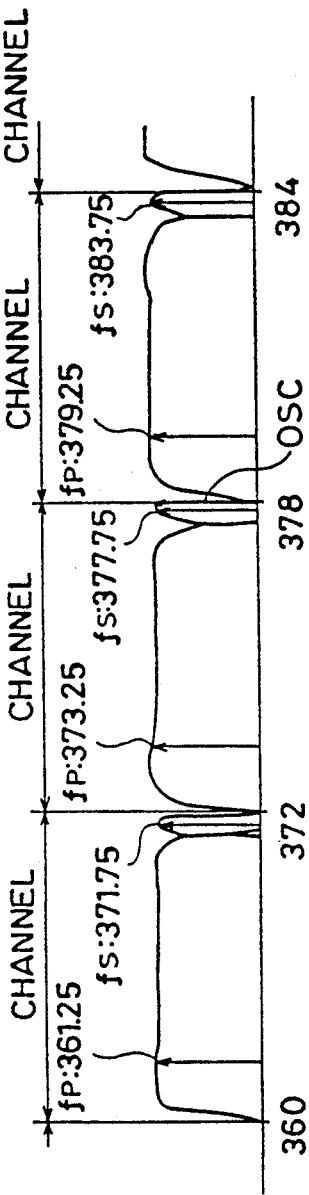

APPARATUS FOR AND METHOD OF IMPROVING THE AFC OF A TELEVISION BROADCAST SATELLITE RECEIVER

BACKGROUND OF THE INVENTION

1. Field of the Invention

The present invention relates generally to an apparatus for and a method of receiving broadcasting, and more particularly, to an apparatus for and a method of receiving satellite broadcasting in which an automatic frequency control operation can be precisely performed.

2. Description of the Background Art

In satellite broadcasting which is currently carried out in Japan, a video signal of the NTSC (National Television System Committee) standard is FM-modulated, to be transmitted as an FM video signal of 12 GHz band.

On the receiving side, this FM video signal of 12 GHz band is converted into a first intermediate frequency signal of 1 GHz band, and further down-converted into a second intermediate frequency signal of a frequency band including 134.26 MHz and 402.78 MHz. Thereafter, the second intermediate frequency signal is FM-demodulated so that a video signal is output.

The oscillation frequency of a local oscillator for down-conversion is satisfactorily controlled by an AFC circuit (automatic frequency control circuit). A plurality of circuits constitute an AFC loop, to perform an AFC operation. Ordinary AFC utilizes the fact that the level of a direct current signal in a synchronizing signal portion of the video signal output from an FM demodulator corresponds to the frequency of the second intermediate frequency signal. Thus, in the ordinary AFC, this level of the direct current signal is detected and the result of this detection is fed back, thereby to control the oscillation frequency of the local oscillator (see U.S. Pat. No. 4,417,279).

However, the direct current signal has the disadvantage of being affected by a drift or the like. Therefore, a technique is considered in which the frequency of the second intermediate frequency signal (referred to as second IF signal hereinafter) is counted and data obtained by this counting is fed back, to control the frequency of the local oscillator.

Referring to FIGS. 1 and 2, this example will be briefly described.

In FIG. 1, a BS (broadcasting satellite) antenna 10 comprises an antenna portion 11 and a first converter 12. The antenna portion 11 is, for example, a parabolic antenna or a plane antenna. The first converter 12 comprises an oscillator 13 and a mixer 14. In the first converter 12, a satellite broadcasting signal (FM video signal) of 12 GHz band received by the antenna portion 11 is mixed with an output of the oscillator 13 by the mixer 14. Consequently, an FM video signal (first intermediate frequency signal) (referred to as first IF signal hereinafter) of approximately 1 GHz band is output. Fluctuations in the frequency of the first IF signal is allowed to +1.5 MHz. The fluctuations are corrected by an AFC operation.

A BS tuner 16 comprises a second down-converter 18, a PLL (phase locked loop) circuit 30, a microcomputer 32 for channel selection, an FM demodulating block 34, a counter circuit 46, an output processing block 64, and a synchronizing separator circuit 68.

The second down-converter 18 converts a first IF signal into a second IF signal suitable for multichannel, for example, of 402.78 MHz band. The second down-converter 18 comprises amplifiers 20 and 24 for automatic gain control, a mixer 22, a variable oscillator 26, and a prescaler 28 for dividing the frequency into ½.

The PLL circuit 30, together with the variable oscillator 26 and the prescaler 28, constitutes a PLL. The microcomputer 32 switches a frequency dividing ratio of a program divider contained in the PLL circuit 30 to switch a receiving channel, and performs the AFC operation. Meanwhile, a general PLL is well-known, which is disclosed in, for example, Japanese Patent Laying-Open Gazette No. 77533/1985.

The FM demodulating block 34 comprises a second IF filter 36, an amplifier 38, a PLL type FM demodulator 40, an AGC detector 42 for generating an AGC voltage, and a 1/256 frequency divider 44 made of ECL.

The counter circuit 46 directly counts an output signal of the 1/256 frequency divider 44. Resetting and counting operations of the counter circuit 46 is controlled by the microcomputer 32. Count data obtained by the counter circuit 46 is applied to the microcomputer 32.

The output processing block 64 comprises a sound DPSK signal demodulator 48, a PCM decoder 50, a sound output circuit 52, an encoder 54 for digital equipment output, a buffer amplifier 56, a low-pass filter/de-emphasis circuit 58, a disversal circuit 60 for removing a triangular wave, and an output amplifier 62.

The PCM decoder 50 is, for example, TM4218N made by Toshiba Corporation, which comprises a terminal 50a from which an NSYNC signal is output at the time of receiving a sound PCM signal in NTSC broadcasting. The sound output circuit 52 comprises a D/A converter for converting digital signals into analog signals and a low-pass filter.

Furthermore, the BS tuner 16 comprises a group 66 of output terminals. The group 66 of output terminals comprises terminals 66a and 66b for sound output, output terminals 66c and 66d of the DAT optical cable connector specifications, an output terminal 66e for a bit stream, an output terminal 66f for a subscription broadcasting decoder, and a video signal output terminal 66g.

The synchronizing separator circuit 68 extracts a vertical synchronizing signal $V_D$, to output the same to the microcomputer 32.

Description is made of an operation of the above described BS tuner 16.

In the BS tuner 16, the counter circuit 46 is operated in a predetermined time period, and count data obtained by the counter circuit 46 is input to the microcomputer 32. The microcomputer 32 compares the count data with predetermined reference data, thereby to detect deviation in the frequency of the second IF signal. The microcomputer 32 changes the frequency dividing ratio of the program divider included in the PLL circuit 30 so as to correct the deviation.

The microcomputer 32 determines a predetermined period during which a counting operation is performed by the counter circuit 46 based on the vertical synchronizing signal $V_D$. This predetermined period is shown in FIG. 2.

In FIG. 2, (a) indicates an output of the PLL type FM demodulator 40, (b) indicates an output of the synchronizing separator circuit 68, (c) indicates a clear signal c1 output from the microcomputer 32 to the counter circuit 46, and (d) indicates a gate signal gate output from the microcomputer 32 for designating the period during which the counting operation is performed by the counter circuit 46.

When the vertical synchronizing signal $V_D$ is input to the microcomputer 32 from the synchronizing separator circuit 68, the microcomputer 32 outputs the clear signal c1. At the same time, the microcomputer 32 outputs the gate signal gate in a vertical synchronization blanking period A (for 1024μ seconds), to allow the counting operation of the counter circuit 46. Thereafter, the microcomputer 32 ceases output of the gate signal gate in a period B and then, outputs the gate signal gate again in a period C of 1024μ seconds. The microcomputer 32 reads the count data obtained by the counter circuit 46 in the subsequent period D. In order to remove the effect of a triangular wave which is an energy diffusion signal, the microcomputer 32 compares a value obtained by adding four results of counting in a two frame period and dividing the result of the addition by 4 with the value of reference data at the time of receiving NTSC broadcasting, to detect deviation in the frequency of the second IF signal. The microcomputer 32 adjusts the frequency dividing ratio of the PLL circuit 30 based on the deviation. In the above described manner, the AFC operation is performed.

The reason why the counter circuit 46 is operated in a period of is that average value AFC for transmission is employed as a system of controlling the frequency of a main carrier in the case of NTSC broadcasting. In addition, the value of the period B in (d) in FIG. 2 is changed for each field to, for example, 6 m seconds, 4 m seconds, 6 m seconds and 8 m seconds, so that the value of the frequency in each portion on a screen is detected. Consequently, fluctuations caused by variation in brightness are prevented.

The microcomputer 32 controls the PLL circuit 30 for each two frame period, to perform an average value AFC operation. When the PLL circuit 30 is controlled for each field, the previous four results of counting may be averaged and the average value may be compared with the value of the reference data, to perform the AFC operation.

Furthermore, although in the above described example, four results of counting in a four field (two frame) period are averaged, it should be noted that the present invention is not limited to the same. For example, results of counting in a four, six or eight frame period may be averaged.

NHK (Nippon Hoso Kyokai) has developed a MUSE (Multiple Sub-Nyquist Sampling Encoding) system as a system of transmitting a high-definition television signal. This MUSE system uses a MUSE signal obtained by converting a high-definition television signal using a technique for bandwidth compression. In the above described BS tuner, if a satellite broadcasting signal obtained by FM-modulating the MUSE signal is to be received, the number of fields respectively having count values to be averaged, which is different from that in the NTSC system, is determined to the cycle of an energy diffusion signal for the MUSE signal.

Additionally, if and when the MUSE signal is received, a period during which the counter circuit 46 is operated is changed to a clamp level period in the MUSE signal. The MUSE signal is described in an article by Yuichi Ninomiya in Nippon Hoso Kyokai entitled "Transmission System MUSE in High-Definition Television Broadcasting" in Nikkei Electronics published by Nikkei McGraw-Hill Company, No. 433, Nov. 2, 1987, pp. 189–212, which is a well-known technique.

However, the clamp level period in the MUSE signal is 23μ seconds, which is very much shorter than a blanking period (1024μ seconds) in an NTSC broadcasting signal. A period during which a counter circuit is operated in the clamp level period in the MUSE signal is even shorter, i.e., 15 to 17μ seconds. Therefore, it is difficult to perform the AFC operation with high precision by the result of counting in this period.

More specifically, at the time of receiving MUSE broadcasting, detecting precision of the displacement "deviation" of the second IF signal per counting in the counter circuit is 17 MHz. With such detecting precision, the AFC operation can not be performed.

It is considered that the second IF signal is directly counted by the counter circuit 46 without employing the 1/256 frequency divider 44. However, it is difficult to fabricate a high-speed counter circuit capable of counting a second IF signal of 402.78 MHz even using ECL (emitter coupled logic). Even using the ECL, only the frequency divider 44 for simply dividing the frequency as shown in FIG. 1 can be achieved.

Additionally, it is also difficult to count a signal obtained by frequency-dividing the second IF signal into $\frac{1}{2}$ to $\frac{1}{4}$ by the frequency divider using the ECL. In addition, if the second IF signal is further frequency-divided, detecting precision per counting is too low, so that a practical problem occurs. The reason is that the amount of fluctuations in the frequency of the second IF signal is simultaneously frequency-divided if the second IF signal is frequency-divided by the frequency divider. Even if the signal frequency-divided into $\frac{1}{2}$ or $\frac{1}{4}$ can be counted, detecting precision per counting in this case is approximately 130 KHz or approximately 260 KHz.

Therefore, it is considered that the ordinary keyed AFC operation is performed at the time of receiving MUSE broadcasting. FIG. 3 illustrates a BS tuner 16 in which the average AFC operation is performed at the time of receiving NTSC broadcasting and the ordinary keyed AFC operation is performed at the time of receiving MUSE broadcasting.

The BS tuner 16 shown in FIG. 3 further comprises a buffer 72 for a MUSE signal, a sample-and-hold circuit 76 and an A/D converter 78. A MUSE decoder 70 is connected to an output terminal 72a receiving an output of the buffer 72. The MUSE decoder 70 outputs a high definition television signal as well as outputs a keyed AFC pulse signal representing a clamp level period only at the time of inputting a MUSE signal.

The keyed AFC pulse signal P is applied to a keyed AFC pulse signal input terminal (high definition television broadcasting terminal) 74. The sample-and-hold circuit 76 samples the keyed AFC pulse signal P applied to the input terminal 74. The A/D converter 78 converts a value sampled by the sample-and-hold circuit 76 into a digital value.

At the time of receiving MUSE broadcasting, a microcomputer 32 compares a digital value obtained by the A/D converter 78 with the value of reference data used at the time of receiving a MUSE signal, to detect the difference therebetween. The microcomputer 32 controls a PLL circuit 30 based on the difference. In the above described manner, an AFC operation is performed.

However, in the BS tuner 16 shown in FIG. 3, an analog signal is sampled and held at the time of receiving MUSE broadcasting. Therefore, the level of the analog signal sampled and held is affected by the temperature or the like. Consequently, it is impossible to achieve high precision and high response of the BS tuner.

SUMMARY OF THE INVENTION

An object of the present invention is to improve the accuracy of an AFC operation of a second intermediate frequency signal in a broadcasting receiving apparatus.

Another object of the present invention is to provide a broadcasting receiving apparatus capable of accurately performing an AFC operation even if each of predetermined level periods for an AFC operation included in a broadcasting signal is short.

Still another object of the present invention is to detect deviation in the frequency of a second intermediate frequency signal with high precision in a broadcasting receiving apparatus even if each of predetermined level periods for an AFC operation included in a broadcasting signal is short.

A further object of the present invention is to provide a broadcasting receiving method in which an AFC operation can be accurately performed even if each of predetermined level periods for an AFC operation included in a broadcasting signal is short.

A still further object of the present invention is to provide a broadcasting receiving method in which deviation in the frequency of a second intermediate frequency signal can be detected with high precision even if each of predetermined level periods for an AFC operation included in a broadcasting signal is short.

In order to attain the above described objects, the broadcasting receiving apparatus according to the present invention is a broadcasting receiving apparatus for demodulating an FM signal converted into a first intermediate frequency signal, which comprises a first oscillating device, first converting device, second converting device, counting device, and adjusting device.

The first oscillating device generates a first oscillation signal of a first frequency. The first converting device mixes an FM signal of a first intermediate frequency with the first oscillation signal of the first frequency, to convert the FM signal of the first intermediate frequency into an FM signal of a second intermediate frequency. The second converting device converts the FM signal of the second intermediate frequency into a signal of a third intermediate frequency lower than the second intermediate frequency by a frequency mixing system. The counting device counts the signal of the third intermediate frequency directly or after frequency division. The adjusting device adjusts the frequency of the first oscillation signal to be generated from the first oscillating device based on an output of the counting device.

In accordance with another aspect of the present invention, the broadcasting receiving apparatus further comprises counting control device for defining an operating period of the counting device.

In accordance with still another aspect of the present invention, the broadcasting receiving apparatus further comprises a stopping device. The stopping device detects the presence or absence of the signal of the third intermediate frequency, to stop adjustment by the adjusting device when the signal of the third intermediate frequency does not exist.

In the broadcasting receiving apparatus according to the present invention, the FM signal of the second intermediate frequency is converted into the signal of the third intermediate frequency lower than the second intermediate frequency by the frequency mixing system. This signal of the third intermediate frequency is counted, to detect deviation in the second intermediate frequency.

Since the signal of the third intermediate frequency is a signal having a low frequency, the signal of the third intermediate frequency can be easily counted using an ordinary counter made of a gate array. In addition, since the FM signal of the second intermediate frequency is down-converted not by frequency division but by the frequency mixing system, the amount of fluctuations in frequency is not frequency-divided. Therefore, detecting precision per counting is not degraded.

Meanwhile, as compared with a case in which the FM signal of the second intermediate frequency is directly counted, detecting precision per counting is degraded by the amount of fluctuations in the oscillation frequency in the second converting device. However, the degradation can be slightly restrained.

Thus, according to the present invention, fluctuations in the frequency of the FM signal of the second intermediate frequency can be detected with high precision for a short time without directly counting the FM signal of the second intermediate frequency. Therefore, a high-precision AFC operation can be performed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a waveform diagram of various signals in the satellite broadcasting receiving apparatus shown in FIG. 1;

FIG. 3 is a block diagram showing a structure of a BS tuner capable of receiving MUSE broadcasting;

FIG. 5 is a waveform diagram of various signals in the BS tuner shown in FIG. 4;

FIG. 6 is a block diagram showing a structure of a BS tuner according to a second embodiment of the present invention;

FIG. 7 is a waveform diagram of various signals in the BS tuner shown in FIG. 6;

FIG. 8 is a waveform diagram of various signals in the BS tuner shown in FIG. 6;

FIG. 12 is a diagram for explaining one example of the oscillation frequency of an oscillator; and FIG. 13 is a diagram for explaining another example of the oscillation frequency of the oscillator.

DESCRIPTION OF THE PREFERRED EMBODIMENTS

Figure 1:
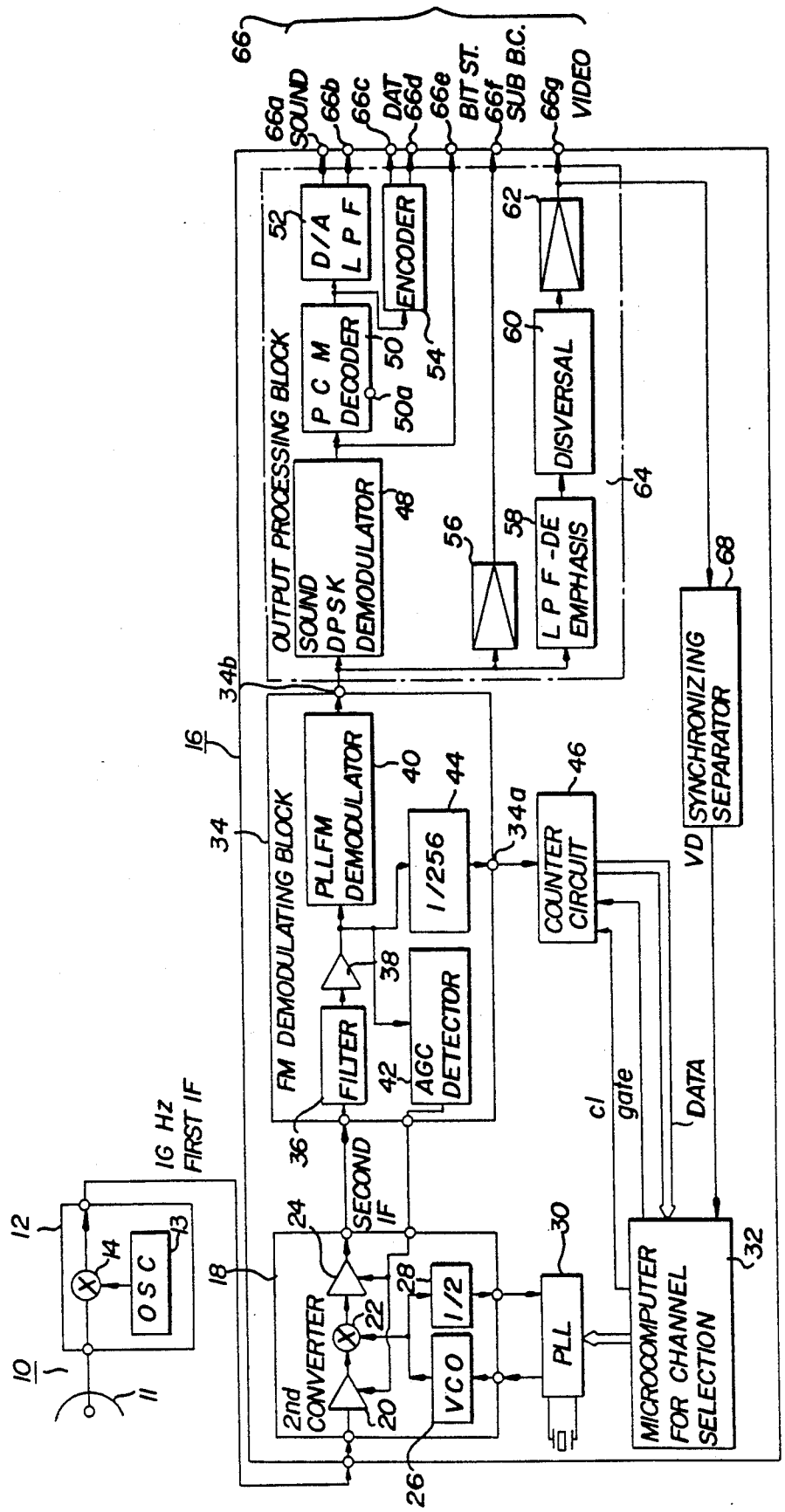
FIG. 1 is a block diagram showing one example of a conventional satellite broadcasting receiving apparatus.

Referring now to the drawings, embodiments of the present invention will be described.

Figure 4:
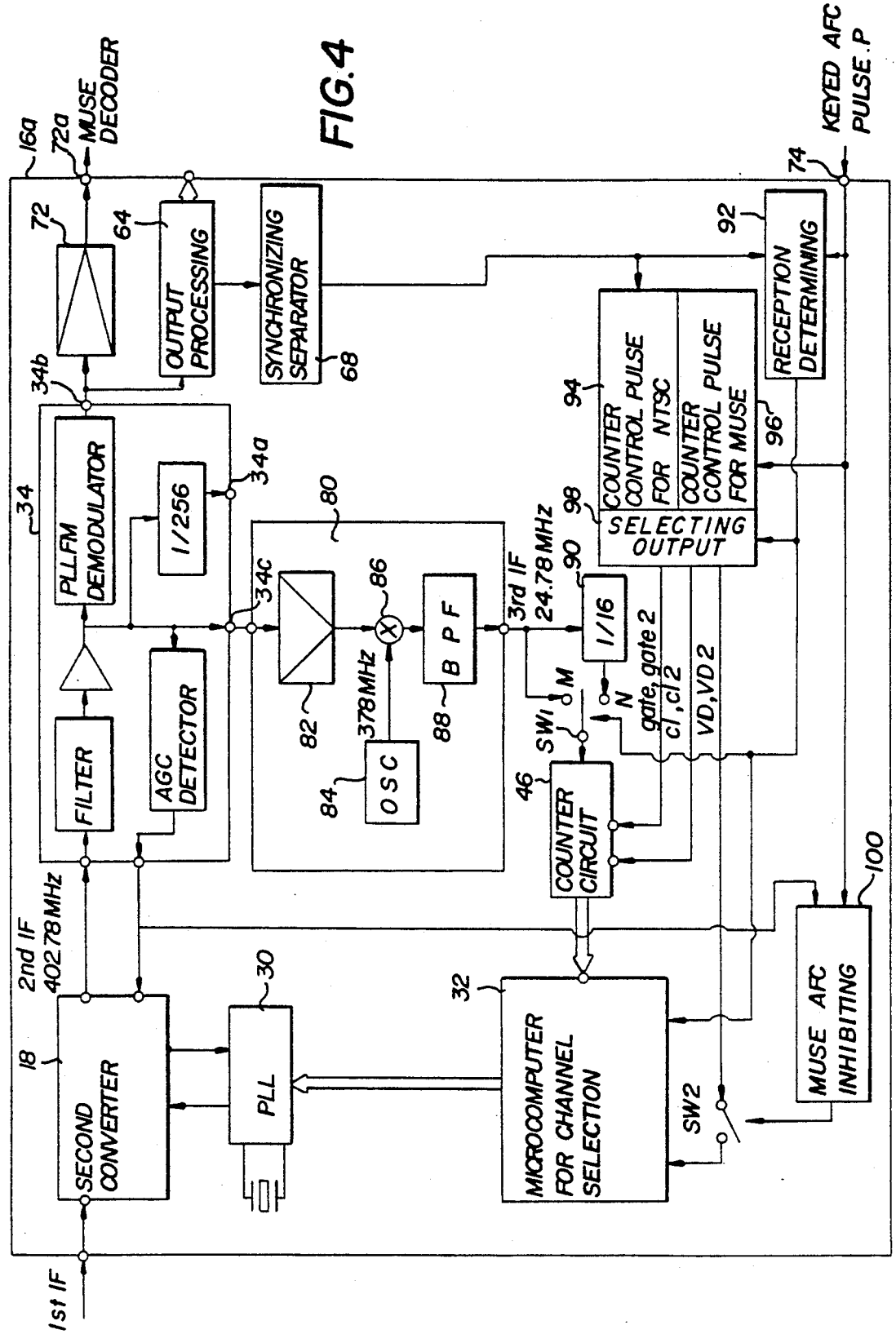
FIG. 4 is a block diagram showing a structure of a BS tuner according to a first embodiment of the present invention.

FIG. 4 is a block diagram showing a structure of a BS tuner according to a first embodiment of the present invention.

A BS tuner 16a shown in FIG. 4 comprises a second down-converter 18, a PLL circuit 30, a microcomputer 32 for channel selection, an FM demodulating block 34, a counter circuit 46, an output processing block 64, a synchronizing separator circuit 68, and a buffer 72 for a MUSE signal, similarly to the BS tuner 16 shown in FIG. 3. Structures of the second down-converter 18 and the FM demodulating block 34 are the same as those shown in FIG. 1. However, the FM demodulating block 34 has a terminal 34c from which a second IF signal of 402.78 MHz is output.

The BS tuner 16a further comprises an AFC down-converter 80. The AFC down-converter 80 comprises an amplifier 82, a high stability oscillator 84 oscillating at a frequency of 378 MHz, a mixer 86, and a band-pass amplifier 88 allowing the passage of a signal of 24.78 MHz. The AFC down-converter 80 mixes the second IF signal of 402.78 MHz applied from the FM demodulating block 34 with an oscillation signal of 378 MHz output from the oscillator 84. Consequently, a third IF signal of 24.78 MHz is obtained.

The BS tuner 16a further comprises a 1/16 frequency divider 90, a receive mode determining circuit 92, a counter control pulse generating circuit 94 for NTSC, a counter control pulse generating circuit 96 for MUSE, a selecting output circuit 98, an AFC inhibiting circuit 100, and switches SW1 and SW2.

The 1/16 frequency divider 90 frequency-divides the third IF signal into 1/16, to apply the same to a terminal N of a switch SW1. The third IF signal from the AFC down-converter 80 is applied to a terminal M of the switch SW1.

The receive mode determining circuit 92 determines reception of the NTSC broadcasting, reception of MUSE broadcasting or other cases based on a synchronizing signal applied from the synchronizing separator circuit 68 and a keyed AFC pulse signal applied through a terminal 74 from the MUSE decoder 70 (see FIG. 3), to apply the result of the determination to the microcomputer 32 as well as to the switch SW1. The switch SW1 is switched to the side of its terminal at the time of receiving MUSE broadcasting while being switched to the side of its terminal N at the time of receiving NTSC broadcasting.

The counter control pulse generating circuit 94 is responsive to the synchronizing signal applied from the synchronizing separator circuit 68 for outputting a gate signal gate, a clear signal c1 and a vertical synchronizing signal $V_D$, similar to the BS tuner 16 shown in FIG. 1.

The counter control pulse generating circuit 96 is responsive to a keyed AFC pulse P applied from the terminal 74 for generating a second gate signal gate 2, a second clear signal c12 and a count data reading control signal $V_D2$. The selecting output circuit 98 selectively outputs the signals from the pulse generating circuit 94 and 96 to the counter circuit 46 and the microcomputer 32 in accordance with the result of the determination of a receive mode applied from the receive mode determining circuit 92.

The AFC inhibiting circuit 100 opens the switch SW2 when MUSE broadcasting is received and an AGC voltage is low (at the time of a weak electric field). Consequently, input of the reading control signal $V_D2$ to the microcomputer 32 is cut off, so that the AFC operation is inhibited. The reason why the AFC operation is inhibited in such a case is that reliability of the AFC operation is decreased at the time of receiving a weak electric field. Meanwhile, at the time of receiving NTSC broadcasting, the sampling time is long. Thus, even if the second IF signal is slightly dropped, no large malfunction of AFC occurs.

Referring now to waveform diagrams of FIGS. 2 and 5, description is made of an operation of the BS tuner 16a shown in FIG. 4.

The microcomputer 32 previously stores data representing a standard frequency dividing ratio corresponding to a plurality of channels of a broadcasting signal. When a user selects a channel to be received, the microcomputer 32 output to the PLL circuit 30 data representing a standard frequency dividing ratio corresponding to the channel. The broadcasting signal is received for a while based on the data representing a frequency dividing ratio.

Thereafter, when the receive mode determining circuit 92 determines that a receive mode is an NTSC receive mode based on the synchronizing signal applied from the synchronizing separator circuit 68, the selecting output circuit 98 outputs the clear signal c1 shown in FIG. 2(c) and the gate signal gate shown in FIG. 2(d) to the counter circuit 46 and outputs the vertical synchronizing signal $V_D$ to the microcomputer 32. In addition, the receive mode determining circuit 92 informs the microcomputer 32 that the receive mode is an NTSC receive mode. Consequently, the microcomputer 32 starts an AFC operation for an NTSC broadcasting signal. On this occasion, the switch SW1 is connected to the side of its terminal N.

In this case, the counter circuit 46 operates, similarly to that in the BS tuner 16 shown in FIG. 1. More specifically, after a counting operation of the counter circuit 46 is terminated, the microcomputer 32 reads count data. The microcomputer 32 averages count data in four fields, to compare the average value with the value of reference data used at the time of NTSC reception. The microcomputer 32 detects deviation in the frequency of the second IF signal based on the result of the comparison. In the above described manner, the AFC operation is performed by adjusting a frequency dividing ratio of the PLL circuit 30, similarly to the case of the BS tuner 16 shown in FIG. 1.

On the other hand, at the time of receiving MUSE broadcasting, a signal output from a terminal 72a is input to the MUSE decoder 70 (see FIG. 3) after channel selection. When the MUSE decoder 70 determines that the signal applied from the terminal 72a is a MUSE signal, the MUSE decoder 70 applies the keyed AFC pulse signal P to the terminal 74 of the BS tuner 16a. The receive mode determining circuit 92 determines that the receive mode is a MUSE receive mode based on the keyed AFC pulse signal P. As a result, the switch SW1 is connected to the side of its terminal M, and the microcomputer 32 starts an AFC operation for a MUSE broadcasting signal.

The selecting output circuit 98 outputs the second gate signal gate 2, the second clear signal c12 and the control signal $V_D2$ generated in the counter control pulse generating circuit 96.

FIG. 5 is a waveform diagram of the signals. In FIG. 5(a) indicates a triangular wave superimposed on the MUSE signal, (b) indicates the keyed AFC pulse signal P output from the MUSE decoder 70, (b') indicates a signal obtained by enlarging the keyed AFC pulse signal P indicated by (b) in the direction of a time axis, (c) indicates the second clear signal c12, (d) indicates the second gate signal gate 2, and (e) indicates the control signal $V_D2$, respectively.

As can be seen from FIG. 5, an output period of the keyed AFC pulse signal, which is a period of a clamp level signal, corresponds to a potential right in the center of the triangular wave. Therefore, at the time of receiving MUSE broadcasting, a value of count data obtained by the counter circuit 46 is not fluctuated for each field due to the effect of the triangular wave. Thus, theoretically, the AFC operation can be performed based on one count data without the effect of the triangular wave. However, in practice, a deviation occurs between the triangular wave and the MUSE signal at the time of superposition, delay for detection of the keyed AFC pulse signal, and the like. Therefore, two count data sampled during at least one cycle (one frame) must be averaged.

In the above described embodiment, the AFC operation is performed by comparing the average value of four count data in a two frame period with the value of reference data used at the time of receiving MUSE broadcasting, in order to increase the reliability. In addition, the microcomputer 32 eliminates one count data too greatly spaced apart from other count data out of the four count data and averages the remaining count data, for safety reasons. The count data too greatly spaced apart from the the reference data may be eliminated and four count data preceding the count data may be averaged.

FIG. 6 is a block diagram showing a structure of a BS tuner according to a second embodiment of the present invention.

In a BS tuner 16b shown in FIG. 6, a clear signal c1 and a gate signal gate at the time of receiving NTSC broadcasting are produced in a microcomputer 32, as in the BS tuner 16 shown in FIG. 1. In addition, at the time of receiving NTSC broadcasting, a signal obtained by frequency-dividing a second IF signal into 1/256 is input to a counter circuit 46.

When a vertical synchronizing signal $V_D$ is applied from a synchronizing separator circuit 68, the microcomputer 32 determines that NTSC broadcasting is received, to perform an AFC operation for an NTSC broadcasting signal. On the other hand, when a keyed AFC pulse signal P is applied, the microcomputer 32 determines that MUSE broadcasting is received, to perform an AFC operation for a MUSE broadcasting signal. When neither of the vertical synchronizing signal $V_D$ and the keyed AFC pulse signal P is applied, the microcomputer 32 stops the AFC operation. More specifically, a frequency dividing ratio of a PLL circuit 30 is not changed and hence, is held at the previous value.

The BS tuner 16b shown in FIG. 6 further comprises a circuit 93 for determining whether or not MUSE broadcasting is received, a counter control signal generating circuit 97 for MUSE, a gate pulse generating circuit 102, and switches SW3 to SW7.

The determining circuit 93 opens the switch SW3 at the time of receiving MUSE broadcasting in order to prevent the vertical synchronizing signal $V_D$ from being erroneously input to the microcomputer 32. The switches SW1, SW6 and SW7 are normally connected to the side of the terminals N. The determining circuit 93 switches the switches SW1, SW6 and SW7 to the side of their terminals M at the time of receiving MUSE broadcasting.

The switch SW4 is a normally closed switch, and the switch SW5 is a normally opened switch. The gate pulse generating circuit 102 outputs a gate pulse signal G1 delayed by approximately 1/60 seconds indicated by (c) in FIG. 7 every time the keyed AFC pulse signal P indicated by (b) in FIG. 2 is input. During a period $\overline{G}$ shown in FIG. 7(c), the normally closed switch SW4 is opened. In addition, during a period G shown in FIG. 7(c), the normally opened switch SW5 is closed. In the above described manner, the regular keyed AFC pulse signal P input at intervals of 60 Hz passes through the switches SW4 and SW5, so that noise pulses are eliminated.

The counter control signal generating circuit 97 comprises an oscillator 104 having an oscillation frequency of 10 MHz, a key pulse synchronizing circuit 106, a counter 108 and a gate generating circuit 110.

The counter control signal generating circuit 97 generates a second clear signal c12 and a second gate signal gate 2. When a period during which a counting operation is performed by the counter circuit 46 is not set with high precision, a malfunction of the AFC occurs. Therefore, according to the present embodiment, a period of the second gate signal gate 2 is set by an output of the oscillator 104.

The oscillator 104 outputs a clock signal CK indicated by (b) in FIG. 8. The key pulse synchronizing circuit 106 outputs the second clear signal c12 indicated by (c) in FIG. 8 after the keyed AFC pulse signal P indicated by (a) in FIG. 8 is input. The counter 108 is cleared by the second clear signal c12. The gate signal generating circuit 110 is set in response to the second clear signal c12. Consequently, the gate signal generating circuit 110 raises the second gate signal gate 2 indicated by (d) in FIG. 8. At the same time, the gate signal generating circuit 110 outputs an operation gate signal K indicated by (e) in FIG. 8 for allowing an operation of the counter 108.

As a result, the counter 108 initiates counting of the clock signal ck. When the counter 108 counts 160 clock signals ck, it outputs a reset signal R indicated by (f) in FIG. 8. The gate signal generating circuit 110 is responsive to the reset signal R for lowering the second gate signal gate 2. In addition, the gate signal generating circuit 110 brings the operation gate signal K into a low level, to inhibit an operation of the counter 108.

An AFC down-converter 80a comprises a high stability oscillator 85 for generating a third IF signal, instead of the oscillator 84 shown in FIG. 4. The high stability oscillator 85 comprises an oscillator 112 having an oscillator frequency of 378 MHz and a PLL circuit 114. The PLL circuit 114 comprises a crystal (precision $10^{-5}$) having a frequency of 4 MHz, and contains an ECL prescaler. A frequency dividing ratio of the PLL circuit 114 is fixed. As described in the foregoing, according to the present embodiment, the oscillator 112 is controlled by forming a PLL. Consequently, fluctuations in the oscillation frequency is suppressed within +37.8 KHz.

Even in the BS tuner 16b shown in FIG. 6, the same measures may be taken as those taken when MUSE broadcasting in a weak electric field is received. For example, as in the BS tuner 16a shown in FIG. 4, reception of broadcasting in a weak electric field may be detected so that an AFC operation is stopped. In addition, as a broadcasting signal becomes a weak electric field, a period for averaging may be set longer. For example, at the time of the weak electric field, the period for averaging may be set to an eight frame period.

The level of an AGC voltage may be displayed in order to inform a user of the presence or absence of broadcasting. In order to inform a user that a receive mode of the BS tuner is a MUSE broadcasting receive mode, a lamp may be lit up in a period during which the keyed AFC pulse signal is input. In order to inform the user that the receive mode of the BS tuner is an NTSC broadcasting receive mode, an output of the terminal 50a of the PCM decoder 50 shown in FIG. 1 may be utilized.

The MUSE decoder 70 shown in FIG. 3 may be contained in the BS tuner. Although in the embodiments shown in FIGS. 4 and 6, a single counter circuit 46 is provided, a counter circuit for MUSE and a counter circuit for NTSC may be separately provided. A TV tuner (tuner for ground broadcasting) for receiving a UHF signal, a VHF signal and a CATV signal may be contained in the BS tuner. In this case, oscillation frequencies of the oscillators 84 and 112 must be set to a frequency between channels so as not to be overlapped with a channel transmission band of the above described television signal.

Figure 9:
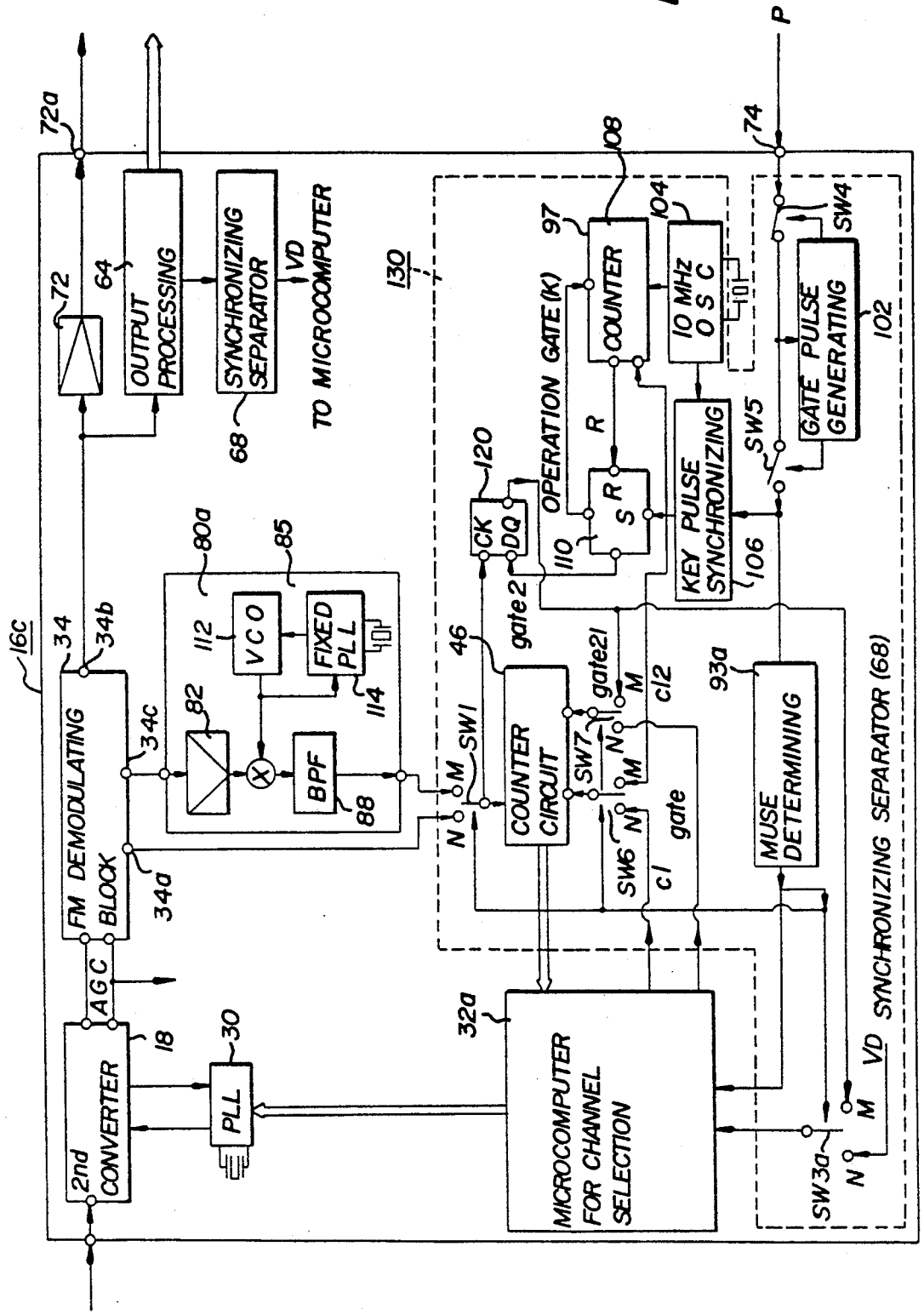
FIG. 9 is a block diagram showing a structure of a BS tuner according to a third embodiment of the present invention.

FIG. 9 is a block diagram showing a structure of a BS tuner according to a third embodiment of the present invention.

In FIG. 9, the same portions as those shown in FIG. 6 have the same reference numerals and hence, the description thereof is not repeated. In the present embodiment, a circuit for implementing the present invention is made an integrated circuit.

In FIG. 9, a gate array IC 130 comprises a counter circuit 46, a circuit 93a for determining whether MUSE broadcasting is received, a counter control signal generating circuit 97, a gate pulse generating circuit 102, a D flip-flop 120 and switches SW1, SW3a, and SW4 to SW7.

When a broadcasting signal received is dropped for the short term and a down-converter 80a fails, a malfunction of the AFC occurs. As a safety measure, the gate array 130 detects the presence or absence of a third IF signal, to stop an AFC operation when the third IF signal does not exist. In this case, the frequency of a second IF signal is held at the previous value.

The determining circuit 93a informs a microcomputer 32a for channel selection that MUSE broadcasting is received. In addition, this determining circuit 93a generally switches the switch SW3a connected to the side of its terminal N to the side of its terminal M at the time of receiving MUSE broadcasting. Consequently, a keyed AFC pulse signal (pseudo second gate signal) gate 21 shaped in the counter control signal generating circuit 97 is applied to the microcomputer 32a.

The microcomputer 32a determines whether a receive mode is an NTSC receive mode or a MUSE receive mode based on a signal from the determining circuit 93a, to execute a program corresponding to the mode. The microcomputer 32a accepts count data from the counter circuit 46 at timing set in response to the fall of a vertical synchronizing signal from the switch SW3a or the pseudo second gate signal gate 21.

The third IF signal is supplied to a clock terminal CK of the D flip-flop 120 which characterizes the present embodiment from the down-converter 80 through the switch SW1. The D flip-flop 120 outputs the pseudo second gate signal gate 21 obtained by delaying the second gate signal gate 2 shown in FIG. 6 in a cycle of the third IF signal. If the supply of the third IF signal is stopped, the D flip-flop 120 holds a value (generally 0) taken before the supply of the third IF signal is stopped. Therefore, the pseudo second gate signal gate 21 is not applied to the microcomputer 32a. Thus, the microcomputer 32a does not accept count data, to substantially stop the AFC operation.

In the BS tuner 16c shown in FIG. 9, the second gate signal gate 2 generated in the same manner as that in the BS tuner 16b shown in FIG. 6 is input to a terminal D of the D flip-flop 120. When the supply of the third IF signal to the clock terminal CK of the D flip-flop 120 is stopped, the pseudo second gate signal gate 21 is not output from an output terminal Q of the D flip-flop 120. The count data is read at timing of the fall of the pseudo second gate signal gate 21. Therefore, if the pseudo second gate signal gate 21 is not output, the microcomputer 32a stops reading of the count data. Thus, a value of an oscillation frequency of a PLL circuit 30 is held which is caused by the AFC operation at the time point when the supply of the third IF signal is stopped.

As described in the foregoing, according to the embodiment shown in FIG. 9, when the supply of the third IF signal is stopped, the supply of the pseudo second gate signal gate 21 to the microcomputer 32a is stopped. Consequently, the AFC operation is stopped.

In the above described embodiment, the D flip-flop 120 is provided between a gate signal generating circuit 110 and the switch SW7. However, the D flip-flop 120 may be provided between the switches SW7 and SW3a.

According to the embodiment shown in FIG. 9, a malfunction to occur when the third IF signal is dropped is prevented by a single D flip-flop 120. However, a detecting circuit for detecting a state in which the third IF signal is dropped and a stopping circuit for stopping the AFC operation of the microcomputer 32a by an output of the detecting circuit at the time of receiving MUSE broadcasting may be separately provided. In this case, the reliability is improved. Means for stopping the AFC operation when the supply of the third IF signal is stopped can be applied to the BS tuner 16a shown in FIG. 4. In addition, the AFC operation of an NTSC broadcasting signal may be stopped (held at the previous value) at the time of receiving NTSC broadcasting.

Figure 10:
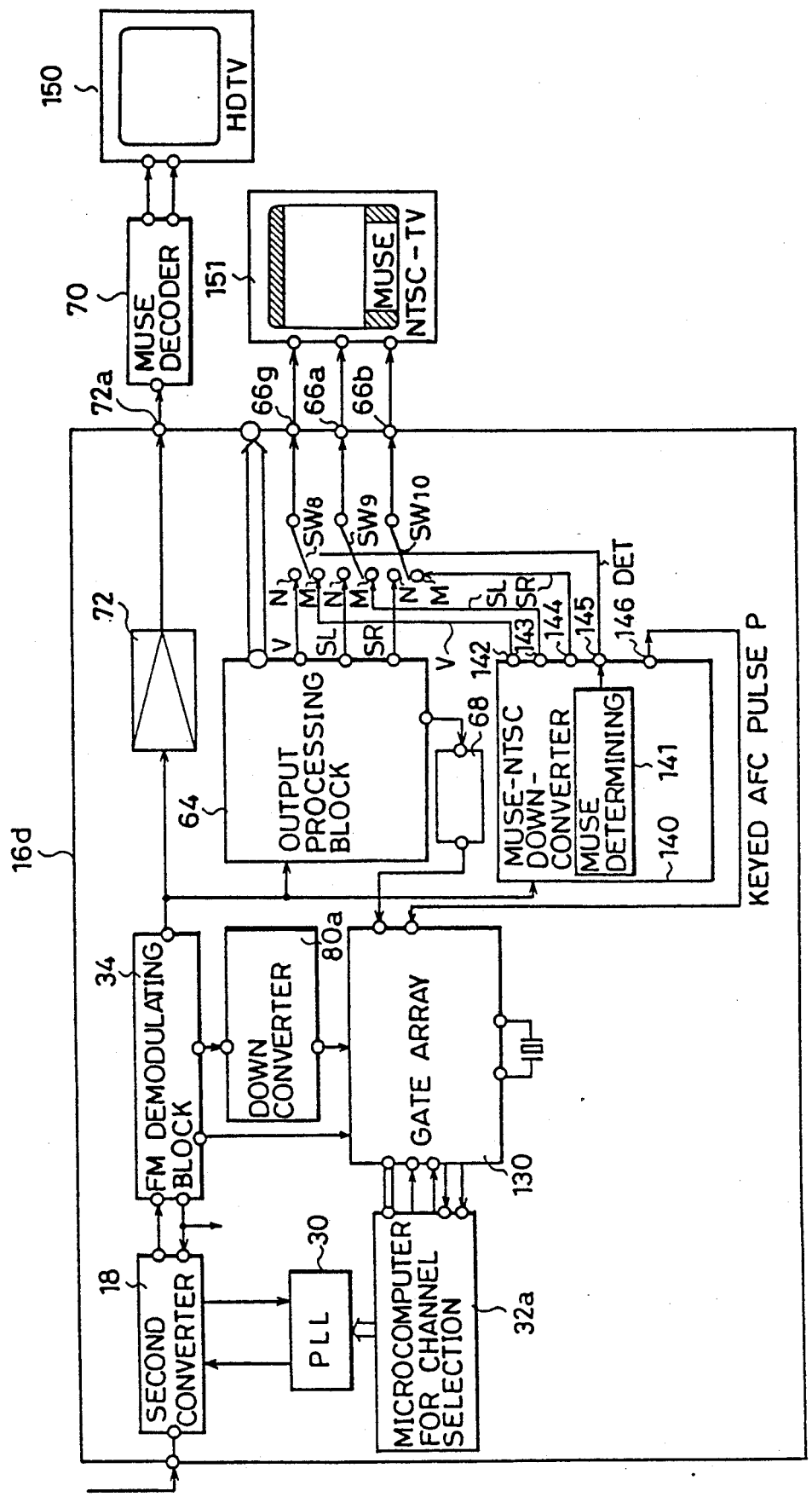
FIG. 10 is a block diagram showing a structure of a BS tuner according to a fourth embodiment of the present invention.
Figure 11:
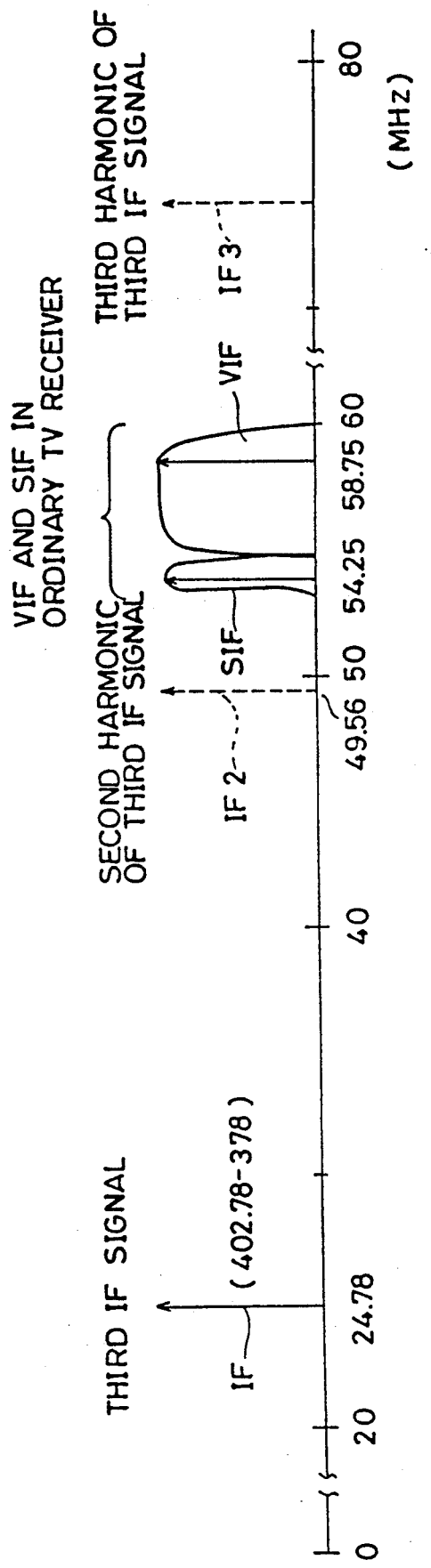
FIG. 11 is a diagram for explaining one example of the frequency of a signal of a third intermediate frequency.

FIG. 10 is a block diagram showing a structure of a BS tuner according to a fourth embodiment of the present invention.

A BS tuner 16d shown in FIG. 10 contains an MUSE-NTSC down-converter 140. The MUSE-NTSC down-converter 140 converts into an NTSC signal a MUSE signal applied from an FM demodulating block 34. A video signal V converted into the NTSC signal is output from an output terminal 142 of the MUSE-NTSC down-converter 140. Sound signals SL and SR converted into the NTSC signal are respectively output from output terminals 143 and 144 of the MUSE-NTSC down-converter 140.

Furthermore, the MUSE-NTSC down-converter 140 comprises a MUSE determining circuit 141. The MUSE determining circuit 141 determines that the MUSE signal is received, to output a MUSE reception detecting signal DET. At the time of receiving MUSE broadcasting, a keyed AFC pulse P is output from an output terminal of the MUSE-NTSC down-converter 140, to be applied to a gate array 130.

A video signal V output from an output processing block 64 is applied to a video signal output terminal 66g through a terminal N of a switch SW8. Sound signals SL and SR output from the output processing block 64 are respectively applied to sound output terminals 66a and 66b through terminals N of switches SW9 and SW10. A video signal V output from the output terminal 142 of the MUSE-NTSC down-converter 140 is applied to a terminal M of the switch SW8. The sound signals SL and SR output from the output terminals 143 and 144 of the MUSE-NTSC down-converter 140 are respectively applied to terminals M of the switches SW9 and SW10.

At the time of receiving MUSE broadcasting, the switches SW8, SW9 and SW10 are switched to the side of their terminals M based on the MUSE reception detecting signal DET from the MUSE determining circuit 141. Structures of other portions in the BS tuner 16d are the same as those in the BS tuner 16c shown in FIG. 9.

An MUSE decoder 70 is connected to a terminal 72a of the BS tuner 16d. A high definition television signal output from the MUSE decoder 70 is applied to a display 150 for a high definition television signal. The video signal and the sound signals output from the terminals 66g, 66a and 66b of the BS tuner 16d are applied to a display 151 for an NTSC signal.

In the above described first to fourth embodiments, the frequency of the third IF signal output from AFC the down-converter 80 or 80b is set as shown in, for example, FIG. 1 so as not to be adversely affected by ordinary VHF, UHF and CATV tuners contained in this BS tuner or arranged in close proximity.

In Japanese television broadcasting, the frequency of a sound intermediate frequency signal SIF is set to 54.25 MHz, and the frequency of a video intermediate frequency signal VIF is set to 58.75 MHz. When the frequency of the third IF signal output from the AFC down-converter 80 or 80a in the BS tuner is set to 24.78 MHz, the frequency of a second harmonic IF2 of the third IF signal becomes 49.56 MHz. Thus, the frequency of the third IF signal is set such that the frequency of the second harmonic of the third IF signal is not overlapped with the frequencies of the sound intermediate frequency signal and the video intermediate frequency signal. In addition, the frequency of a third IF signal is set such that the frequency of the third harmonic IF3 of the third IF signal is not overlapped with the frequencies of the sound intermediate frequency signal SIF and the video intermediate frequency signal VIF.

Additionally, the oscillation frequencies of the oscillators 84 and 112 included in the AFC down-converters 80 and 80a are set as shown in FIG. 12. As shown in FIG. 12, in Japanese television broadcasting, an empty region exists between the VHF band and the UHF band. Thus, the frequency of an oscillation signal OSC output from the oscillators 84 and 112 is set between 220 MHz and 470 MHz. In this case, the frequency of the oscillation signal OSC is set such that a second harmonic component OSC 2 of the oscillation signal OSC is not overlapped with the frequencies of a video carrier $f_P$ and a sound carrier $f_S$ in any one channel. For example, when the frequency of the oscillation signal OSC is set to 378 MHz, the frequency of the second harmonic component OSC 2 becomes an exactly intermediate frequency between the frequencies of the video carrier $f_P$ and the sound carrier $f_S$ in the 60th channel.

If channels are assigned to the empty region between the VHF band and the UHF band, the frequencies of the oscillation signals output from the oscillators 84 and 112 are set so as not to be overlapped with the frequencies of the video carrier $f_P$ and the sound carrier $f_S$ in their channels. In FIG. 13, the frequency of the oscillation signal is set to 378 MHz between the frequency 377.75 MHz of the sound carrier $f_S$ and the frequency 379.25 MHz of the video carrier $f_P$. In addition, this frequency 378 MHz is exactly a frequency in a boundary between the channels.

As described in the foregoing, according to the above described embodiments, the second IF signal is converted into the third IF signal by the frequency mixing system. Therefore, the amount of fluctuations in the frequency of the second IF signal is not frequency-divided. Thus, the fluctuations in the frequency of the second IF signal can be detected with high precision, so that a high-precision AFC operation can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A broadcasting receiving apparatus for demodulating an FM signal converted into a first intermediate frequency, comprising:

first oscillating means for generating a first oscillation signal of a first frequency;

first converting means for converting said FM signal of said first intermediate frequency into an FM signal of a second intermediate frequency by mixing said FM signal of said first intermediate frequency with said first oscillation signal of said first frequency;

FM demodulating means for demodulating said FM signal of said second intermediate frequency;

second converting means for converting said demodulated FM signal of said second intermediate frequency into an output signal having a third intermediate frequency which is lower than said second intermediate frequency by a frequency mixing system;

counting means for counting the output signal, having said third intermediate frequency, directly or after frequency division; and adjusting means for adjusting the frequency of said first oscillation signal to be generated from said first oscillating means based on an output of said counting means.

2. The broadcasting receiving apparatus according to claim 1, wherein said second converting means further comprises second oscillating means for generating a second oscillation signal of a second frequency, and mixing means for mixing said FM signal of said second intermediate frequency with said second oscillation signal, to output the signal of said third intermediate frequency.

3. The broadcasting receiving apparatus according to claim 2, wherein said second oscillating means further comprises PLL means for maintaining said second frequency of said second oscillation signal.

4. The broadcasting receiving apparatus according to claim 2, which further comprises
counting control means for defining an operating period of said counting means.

5. The broadcasting receiving apparatus according to claim 4, wherein said FM signal comprises a first FM signal including a periodical first period at a constant level or a second FM signal including a periodical second period at a constant level, and said first period is shorter than said second period, and which further comprises frequency-dividing means for frequency-dividing the signal of said third intermediate frequency,
said counting control means defining the operating period of said counting means in response to said first period at the time of receiving said first FM signal and defining the operating period of said counting means in response to said second period at the time of receiving said second FM signal,
said counting means counting the signal of said third intermediate frequency from said second converting means at the time of receiving said first FM signal and counting an output of said frequency-dividing means at the time of receiving said second FM signal.

6. The broadcasting receiving apparatus according to claim 5, which further comprises
reception determining means determining whether said first FM signal is received or said second FM signal is received based on said first period included in said first FM signal or said second period included in said second FM signal.

7. The broadcasting receiving apparatus according to claim 5, wherein
said first FM signal is an FM signal of a MUSE signal, and
said second FM signal is an FM signal of an NTSC signal.

8. The broadcasting receiving apparatus according to claim 7, which further comprises
picture converting means for converting said MUSE signal into said NTSC signal.

9. The broadcasting receiving apparatus according to claim 4, wherein said FM signal comprises a first FM signal including a periodical first period at a constant level or a second FM signal including a periodical second period at a constant level, and said first period is shorter than said second period,
said counting control means defining the operating period of said counting means in response to said first period at the time of receiving said first FM signal and defining the operating period of said counting means in response to said second period at the time of receiving said second FM signal,
said counting means counting the signal of said third intermediate frequency from said second converting means at the time of receiving said first FM signal and counting said FM signal of said second intermediate frequency from said first converting means at the time of receiving said second FM signal.

10. The broadcasting receiving apparatus according to claim 9, which further comprises
reception determining means for determining whether or not said first FM signal is received based on said first period included in said FM signal.

11. The broadcasting receiving apparatus according to claim 10, which further comprises stopping means for detecting the presence or absence of the signal of said third intermediate frequency, to stop an operation of said adjusting means when the signal of said third intermediate frequency does not exist,
said counting means, said counting control means said reception determining means and said stopping means being made integrated circuits.

12. The broadcasting receiving apparatus according to claim 9, wherein said counting control means comprises
third oscillating means for generating pulse signals at a predetermined frequency,
a counter responsive to the start of said first period included in said first FM signal for counting a predetermined number of the pulse signals generated from said third oscillating means, and
signal generating means for generating a predetermined signal for defining the operating period of said counting means from the start of a ounting operation of said counter to the end of the counting operation.

13. The broadcasting receiving apparatus according to claim 9, wherein
said first FM signal is an FM signal of a MUSE signal, and
said second FM signal is an FM signal of an NTSC signal.

14. The broadcasting receiving apparatus according to claim 13, which further comprises
picture converting means for converting into an NTSC signal a MUSE signal obtained by FM-demodulating said second intermediate frequency.

15. The broadcasting receiving apparatus according to claim 9, which further comprises frequency-dividing means for frequency-dividing said FM signal of said second intermediate frequency from said first converting means at the time of receiving said second FM signal,
wherein said counting means counts the frequency-divided output from said dividing means.

16. The broadcasting receiving apparatus according to claim 2, wherein said second frequency of said second oscillation signal is set such that the frequencies of said second oscillation signal and a harmonic of said second oscillation signal generated from said second oscillating means are not overlapped with a video carrier signal and a sound carrier signal included in a receivable ordinary broadcasting signal.

17. The broadcasting receiving apparatus according to claim 1, which further comprises
first stopping means for detecting the presence or absence of the signal of said third intermediate frequency, to stop an operation of said adjusting means when the signal of said third intermediate frequency does not exist.

18. The broadcasting receiving apparatus according to claim 1, which further comprises
stopping means for stopping an operation of said adjusting means when a voltage level of said FM signal of said second intermediate frequency is lower than a predetermined level.

19. The broadcasting receiving apparatus according to claim 1, wherein the frequency of the signal of said third intermediate frequency is set such that the frequencies of the signal of said third intermediate frequency and a harmonic of the signal of said third intermediate frequency are not overlapped with a video intermediate frequency signal and a sound intermediate frequency signal of a tuner for ordinary broadcasting.

20. A method of demodulating an FM signal converted into a first intermediate frequency, comprising the steps of:
generating a first oscillation signal of a first frequency;
mixing said FM signal of said first intermediate frequency with said first oscillation signal of said first frequency, therein to convert said FM signal of said first intermediate frequency into an FM signal of a second intermediate frequency;
demodulating said FM signal of said second intermediate frequency;
converting said demodulated FM signal of said second intermediate frequency into a third intermediate frequency which is lower than said second intermediate by a frequency mixing system;
counting said third intermediate frequency directly or after frequency division; and
adjusting the frequency of said first oscillation signal based on the result of said counting.

21. A broadcasting receiving apparatus for demodulating an FM signal converted into a first intermediate frequency, comprising:
first oscillating means for generating a first oscillation signal of a first frequency;
first converting means for converting said FM signal of said first intermediate frequency into an FM signal of a second intermediate frequency by mixing said FM signal of said first intermediate frequency with said first oscillation signal of said first frequency wherein said FM signal comprises
a first FM signal including a periodical first period at a constant level or a second FM signal including a periodical second period at a constant level, and said first period is shorter than said second period;
second converting means for converting said FM signal of said second intermediate frequency into an output signal having a third intermediate frequency which is lower than said second intermediate frequency by a frequency mixing system, wherein said second converting means includes
second oscillating means for generating a second oscillation signal of a second frequency, and
mixing means for mixing said FM signal of said second intermediate frequency with said second oscillation signal, to output the signal of said third intermediate frequency;
frequency-dividing means for frequency-dividing the signal of said third intermediate frequency;
counting means for counting the output signal, having said third intermediate frequency, directly or after frequency division, said counting means counting the signal of said third intermediate frequency from said second converting means at the time of receiving said first FM signal and counting an output of said frequency-dividing means at the time of receiving said second FM signal;
counting control means for defining an operating period of said counting means, said counting control means defining the operating period of said counting means in response to said first period at the time of receiving said first FM signal and defining the operating period of said counting means in response to said second period at the time of receiving said second FM signal; and
adjusting means for adjusting the frequency of said first oscillation signal to be generated from said first oscillating means based on an output of said counting means.

22. A broadcasting receiving apparatus for demodulating an FM signal converted into a first intermediate frequency, comprising:
first oscillating means for generating a first oscillation signal of a first frequency;
first converting means for converting said FM signal of said first intermediate frequency into an FM signal of a second intermediate frequency by mixing said FM signal of said first intermediate frequency with said first oscillation signal of said first frequency wherein said FM signal comprises
a first FM signal including a periodical first period at a constant level or a second FM signal including a periodical second period at a constant level, and said first period is shorter than said second period;
second converting means for converting said FM signal of said second intermediate frequency into an output signal having a third intermediate frequency which is lower than said second intermediate frequency by a frequency mixing system, wherein said second converting means includes
second oscillating means for generating a second oscillation signal of a second frequency, and
mixing means for mixing said FM signal of said second intermediate frequency with said second oscillation signal, to output the signal of said third intermediate frequency;
counting means for counting the output signal, having said third intermediate frequency, directly or after frequency division, said counting means counting the signal of said third intermediate frequency from said second converting means at the time of receiving said first FM signal and counting said FM signal of said second intermediate frequency from said first converting means at the time of receiving said second FM signal;
counting control means for defining an operating period of said counting means, said counting control means defining the operating period of said counting means in response to said first period at the time of receiving said first FM signal and defining the operating period of said counting means in response to said second period at the time of receiving said second FM signal; and
adjusting means for adjusting the frequency of said first oscillation signal to be generated from said first oscillating means based on an output of said counting means.

* * * * *